United States Patent
Joo et al.

(10) Patent No.: US 9,627,027 B2
(45) Date of Patent: Apr. 18, 2017

(54) SEMICONDUCTOR DEVICE PERFORMING DIFFERENT TYPES OF REFRESH OPERATIONS AND METHOD OF DRIVING THE SAME

(71) Applicant: SK hynix Inc., Gyeonggi-do (KR)

(72) Inventors: No-Guen Joo, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/656,257

(22) Filed: Mar. 12, 2015

(65) Prior Publication Data

US 2016/0111140 A1   Apr. 21, 2016

(30) Foreign Application Priority Data

Oct. 17, 2014  (KR) ........................ 10-2014-0141052

(51) Int. Cl.
  *G11C 7/00* (2006.01)
  *G11C 8/00* (2006.01)
  *G11C 11/406* (2006.01)

(52) U.S. Cl.
  CPC ... *G11C 11/40611* (2013.01); *G11C 11/40615* (2013.01); *G11C 11/40618* (2013.01)

(58) Field of Classification Search
  USPC .............. 365/194, 222, 230.06, 230.08, 236
  See application file for complete search history.

(56) References Cited

U.S. PATENT DOCUMENTS

| | | | | |
|---|---|---|---|---|
| 5,629,898 A * | 5/1997 | Idei | ........................ | G11C 11/406 365/222 |
| 5,724,296 A * | 3/1998 | Jang | ........................ | G11C 11/406 365/222 |
| 5,995,434 A * | 11/1999 | Ryu | ........................ | G11C 7/12 365/222 |
| 6,842,392 B2 * | 1/2005 | Mizugaki | ................ | G11C 8/08 365/222 |
| 6,930,946 B2 * | 8/2005 | Otsuka | .................. | G11C 11/406 365/222 |
| 7,057,961 B2 * | 6/2006 | Perner | .................. | G11C 11/406 365/222 |
| 7,345,941 B2 * | 3/2008 | Matsui | .................. | G11C 11/406 365/222 |
| 7,352,642 B2 * | 4/2008 | Ohsawa | ................ | G11C 11/406 365/222 |
| 7,804,731 B2 * | 9/2010 | Ohsawa | ................ | G11C 11/406 365/222 |
| 8,072,829 B2 * | 12/2011 | Kim | ..................... | G11C 11/406 365/222 |

(Continued)

FOREIGN PATENT DOCUMENTS

KR  1020120081352  7/2012
KR  1020130115066  10/2013

*Primary Examiner* — Trong Phan
(74) *Attorney, Agent, or Firm* — IP & T Group LLP

(57) ABSTRACT

A semiconductor device includes a 1st controller suitable for generating refresh control signals for controlling at least two types of refresh operations according to an external refresh signal; and a 2nd controller suitable for controlling the at least two types of refresh operations to be evenly and alternately performed on a plurality of word lines according to the refresh control signals, a predetermined number of times during a unit refresh period corresponding to the external refresh signal.

10 Claims, 20 Drawing Sheets

(56) References Cited

U.S. PATENT DOCUMENTS

| | | | | |
|---|---|---|---|---|
| 8,576,653 B2* | 11/2013 | Lin | .................... | G11C 11/40615 |
| | | | | 365/222 |
| 8,659,967 B2* | 2/2014 | Tu | ......................... | G11C 11/406 |
| | | | | 365/222 |
| 8,705,302 B2* | 4/2014 | Kang | ................ | G11C 11/40615 |
| | | | | 365/222 |
| 8,756,474 B2* | 6/2014 | Shibata | .............. | G11C 16/3431 |
| | | | | 365/222 |
| 9,025,405 B2* | 5/2015 | Jeong | .................... | G11C 11/402 |
| | | | | 365/222 |
| 9,076,548 B1* | 7/2015 | Park | ......................... | G11O 5/02 |
| 9,093,173 B1* | 7/2015 | Cha | ........................ | G11C 11/406 |
| 9,165,634 B2* | 10/2015 | Song | ..................... | G11C 11/406 |

\* cited by examiner

SEMICONDUCTOR DEVICE PERFORMING DIFFERENT TYPES OF REFRESH OPERATIONS AND METHOD OF DRIVING THE SAME

CROSS-REFERENCE TO RELATED APPLICATIONS

The present application claims priority of Korean Patent Application No. 10-2014-0141052, filed on Oct. 17, 2014, which is incorporated herein by reference in its entirety.

BACKGROUND

1. Field

Exemplary embodiments of the present invention relate to a semiconductor design technology, and more particularly, to a semiconductor device which supports a refresh operation, and a method for driving the same.

2. Description of the Related Art

With the increase in integration degree of memories, intervals between word lines has been reduced. Reducing the intervals between word lines has caused an increase in the coupling effect between adjacent word lines.

Whenever data is inputted to or outputted from a memory cell, a word line is toggled between an active state and an inactive state. As the coupling effect between adjacent word lines increases, as described above, data of memory cells coupled to a word line adjacent to a word line which is frequently activated may be damaged. This phenomenon is referred to as word line disturbance. Word line disturbance may cause a problem in that the data of the memory cells are damaged before the memory cells are refreshed.

In order to solve this problem, a smart refresh technology has emerged. The smart refresh technology detects a target word line, which has been frequently activated, and refreshes memory cells coupled to word lines adjacent to the target word line. The smart refresh technology includes an additional refresh operation which is performed separately from a normal refresh operation (for example, auto-refresh operation).

FIG. 1 is a timing diagram illustrating an operation of a 1st conventional semiconductor device.

Referring to FIG. 1, two auto-refresh operations AR and two smart refresh operations SR+ and SR−1 are performed in response to a single external refresh signal EXT_REF. During a unit refresh period corresponding to the single external refresh signal EXT_REF, a plurality of banks BANK0/1, BANK2/3, BANK4/5, and BANK6/7 activate 1st to 8th word lines at the same time according to a 1st auto-refresh operation AR, activate an (N+1)th word line adjacent to an Nth word line according to a 1st smart refresh operation SR+1, activate an (N−1)th word line adjacent to the Nth word line according to a 2nd smart refresh operation SR−1, and finally activate 9th to 16th word lines at the same time according to a 2nd auto-refresh operation AR.

In other words, two auto-refresh operations AR and two smart refresh operations SR+1 and SR−1 during the unit refresh period per the external refresh signal EXT_REF are repetitively performed.

When the 1st semiconductor device is operated as described above, the following problems may occur. As the two auto-refresh operations AR and the two smart refresh operations SR+1 and SR−1 are repetitively performed, the 2nd auto-refresh operation AR at the previous unit refresh period and the 1st auto-refresh operation AR at the current unit refresh period are successively performed. The auto-refresh operation AR activates a larger number of word lines at the same time as the smart refresh operations SR+1 and SR−1. Thus, when the auto-refresh operations are successively performed, overcurrent occurs and current consumption inevitably increases.

FIG. 2 is a timing diagram illustrating an operation of a conventional 2nd semiconductor device.

Referring to FIG. 2, three auto-refresh operations AR and two smart refresh operations SR+1 and SR−1 are performed in response to a single external refresh signal EXT_REF. During a unit refresh period corresponding to the single external refresh signal EXT_REF, a plurality of banks BANK0/1, BANK2/3, BANK4/5, and BANK6/7 activate 1st to 8th word lines at the same time according to a 1st auto-refresh operation AR, activate an (N+1)th word line adjacent to an Nth word line according to a 1st smart refresh operation SR+1, activate an (N−1)th word line adjacent to the Nth word line according to a 2nd smart refresh operation SR−1, activate 9th to 16th word lines at the same time according to a 2nd auto-refresh operation AR, and finally activate 17th to 24th word lines at the same time according to a 3rd auto-refresh operation AR.

In other words, three auto-refresh operations AR and two smart refresh operations SR+1 and SR−1 during the unit refresh period per the external refresh signal EXT_REF are repetitively performed.

Even when the 2nd semiconductor device is operated as described above, the above-described problems may occur. Since the 2nd auto-refresh operation AR and the 3rd auto-refresh operation AR are successively performed at each unit refresh period, overcurrent occurs and current consumption inevitably increases.

SUMMARY

Various embodiments are directed to a semiconductor device capable of alternately performing an auto-refresh operation and a smart refresh operation and a method of driving the same.

In an embodiment, a semiconductor device may include: a 1st controller suitable for generating refresh control signals for controlling two or more types of refresh operations according to an external refresh signal; and a 2nd controller suitable for controlling a plurality of word lines according to the refresh control signals such that the two or more types of refresh operations are alternately performed a predetermined number of times during a unit refresh period corresponding to the external refresh signal.

The two or more types of refresh operations may include an auto-refresh operation and a smart refresh operation.

Among the plurality of word lines, the 2nd controller may alternately enable one or more word lines for the auto-refresh operation and one or more word lines for the smart refresh operation.

The 2nd controller may enable two or more word lines at the same time during the auto-refresh operation, and enable one word line during the smart refresh operation.

In an embodiment, a semiconductor device may include: a refresh controller suitable for generating an auto-refresh enable signal and a smart refresh enable signal which are toggled in the opposite manner to each other, and generating an internal refresh signal which pulses whenever the auto-refresh enable signal and the smart refresh enable signal are activated, at each unit refresh period corresponding to an external refresh signal; an address providing unit suitable for alternately providing an auto-refresh address and a smart refresh address according to the auto-refresh enable signal, the smart refresh enable signal, and a target address; and a word line enable unit suitable for alternately enabling a word line corresponding to the auto-refresh address in response to the internal refresh signal corresponding to the auto-refresh enable signal and a word line corresponding to the smart refresh address in response to the internal refresh signal corresponding to the smart refresh enable signal by a predetermined number of times during the unit refresh period.

The refresh controller may include: a counting unit suitable for generating a plurality of count signals by counting the internal refresh signal; a refresh enable unit suitable for generating the auto-refresh enable signal, the smart refresh enable signal, and 1st and 2nd select control signals according to the plurality of count signals; and an internal refresh signal generation unit suitable for generating the internal refresh signal according to the external refresh signal, the auto-refresh enable signal, the smart refresh enable signal, and the 1st and 2nd select control signals.

The counting unit may include: a count reset section suitable for generating a count reset signal according to one or more of the plurality of count signals; and a dividing circuit section suitable for being reset according to the count reset signal, and generating the plurality of count signals by dividing the internal refresh signal.

The refresh enable unit may include: a combinational logic section suitable for logically combining a 1st count signal obtained by dividing the internal refresh signal by two and a 2nd count signal obtained by dividing the internal refresh signal by four, among the plurality of count signals, and generating the plurality of select control signals; an inverting section suitable for generating the auto-refresh enable signal by inverting the 1st count signal; and a non-inverting section suitable for generating the smart refresh enable signal by non-inverting the 1st count signal.

The internal refresh signal generation unit may include: a delay section suitable for generating a delayed refresh signal by delaying the external refresh signal by a predetermined delay time; a 1st refresh pulsing section suitable for generating a plurality of 1st refresh pulse signals which sequentially pulse in response to an active period of the auto-refresh enable signal during the unit refresh period, according to the delayed refresh signal, the auto-refresh enable signal, the 1st select control signal, and a 2nd delayed refresh pulse signal, and generating a plurality of 1st delayed refresh pulse signals by delaying the plurality of 1st refresh pulse signals; a 2nd refresh pulsing section suitable for generating a plurality of 2nd refresh pulse signals which sequentially pulse in response to an active period of the smart refresh enable signal during the unit refresh period, according to the plurality of 1st delayed refresh pulse signals obtained by delaying the plurality of 1st refresh pulse signals, the smart refresh enable signal, and the 2nd select control signal, and generating the 2nd delayed refresh pulse signal by delaying any one of the plurality of 2nd refresh pulse signals; and an internal refresh signal output section suitable for generating the internal refresh signal according to the plurality of 1st and 2nd refresh pulse signals and the smart refresh enable signal.

The address providing unit may include: an auto-refresh address generation section suitable for sequentially generating the auto-refresh address according to the auto-refresh enable signal; a smart refresh address generation section suitable for sequentially generating the smart refresh address according to the smart refresh enable signal and the target address; and a refresh address selection section suitable for alternately outputting the auto-refresh address and the smart refresh address according to the auto-refresh enable signal and the smart refresh enable signal.

The auto-refresh address generation section may include a count circuit suitable for sequentially generating the auto-refresh address which is up-counted or down-counted whenever the auto-refresh enable signal is activated.

The smart refresh address generation section may include: a latch suitable for latching the target address and outputting the latched target address as a latch address according to the smart refresh enable signal; and an output section suitable for sequentially outputting the smart refresh address corresponding to the latch address whenever the smart refresh enable signal is activated.

The output section sequentially may output the smart refresh address corresponding to an (N+1)th word line and the smart refresh address corresponding to an (N−1)th word line, according to the latch address corresponding to an Nth word line among the plurality of word lines.

The word line enable unit may enable two or more word lines corresponding to the auto-refresh address at the same time, and enables a single word line corresponding to the smart refresh address.

In an embodiment, a method of driving a semiconductor device may include: receiving an external refresh signal; and performing a plurality of normal refresh operations and a plurality of target refresh operations at different timings per the external refresh signal, wherein the normal refresh operations and the target refresh operations are alternately performed.

The performing of the plurality of normal refresh operations and the plurality of target refresh operations may alternately enable word lines related to the auto-refresh operations and word lines related to the target refresh operations.

The performing of the plurality of normal refresh operations and the plurality of target refresh operations may enable two or more word lines at the same time during the normal refresh operation, and may enable a single word line during the target refresh operation.

The performing of the plurality of normal refresh operations and the plurality of target refresh operations may include performing two auto-refresh operations and two target refresh operations according to the external refresh signal.

The performing of the plurality of normal refresh operations and the plurality of target refresh operations may include performing three auto-refresh operations and two target refresh operations according to the external refresh signal.

DETAILED DESCRIPTION

Figure 1:
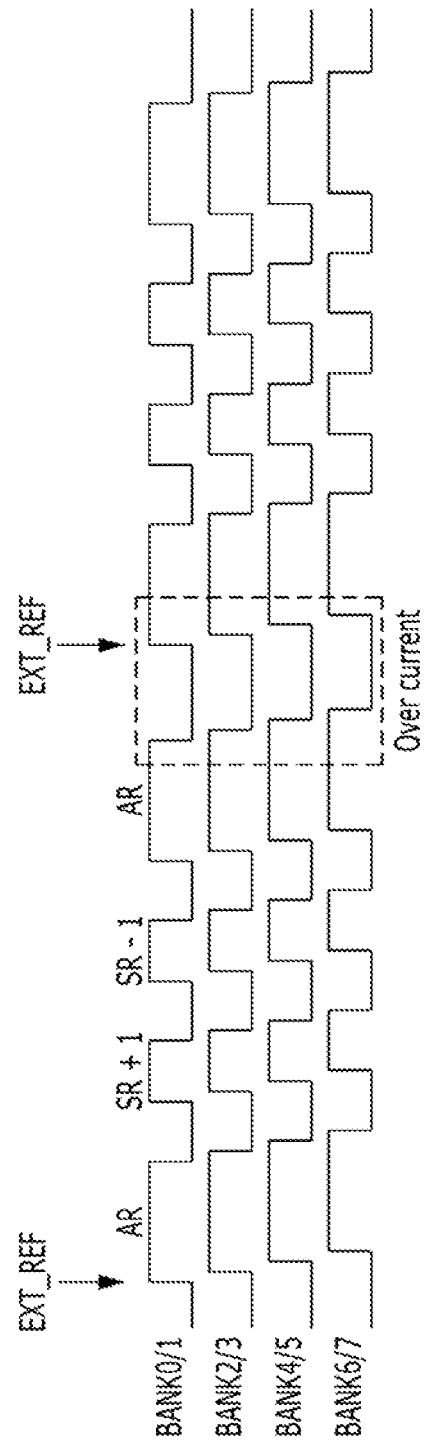
FIG. 1 is a timing diagram illustrating an operation of a 1st conventional semiconductor device.
Figure 2:
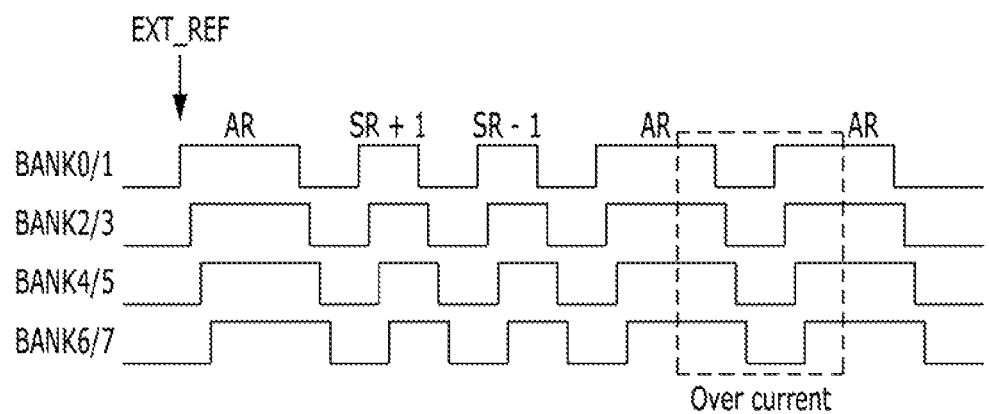
FIG. 2 is a timing diagram illustrating an operation of a 2nd conventional semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
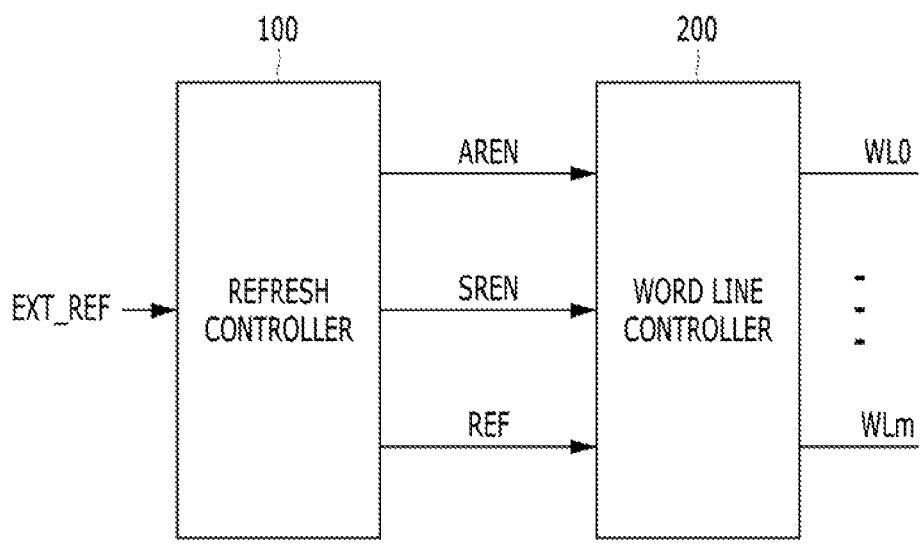
FIG. 3 is a block diagram illustrating a semiconductor device in accordance with a 1st embodiment of the present invention.

FIG. 3 is a block diagram illustrating a semiconductor device in accordance with a 1st embodiment of the present invention.

Referring to FIG. 3, the semiconductor device may include a refresh controller 100 and a word line controller 200.

The refresh controller 100 may generate refresh control signals AREN, SREN, and REF for controlling two or more types of refresh operations according to an external refresh signal EXT_REF.

The word line controller 200 may control a plurality of word lines WL0 to WLm such that the two or more types of refresh operations are alternately performed a predetermined number of times according to the refresh control signals AREN, SREN, and REF during a unit refresh period corresponding to the external refresh signal EXT_REF.

The two or more types of refresh operations may include an auto-refresh operation for activating the plurality of word lines WL0 to WLm one or more at a time according to a predetermined sequence, and a smart refresh operation for activating target word lines of the plurality of word lines WL0 to WLm at least one by one according to a predetermined sequence. Hereafter, the auto-refresh operation and the smart refresh operation will be taken as an example of the two types of refresh operations.

The refresh control signals AREN, SREN, and REF may include an auto-refresh enable signal AREN for the auto-refresh operation, a smart refresh enable signal SREN for the smart refresh operation, and an internal refresh signal REF corresponding to the external refresh signal EXT_REF. Hereafter, the auto-refresh enable signal AREN, the smart refresh enable signal SREN, and the internal refresh signal REF will be taken as an example for describing the refresh control signals AREN, SREN, and REF.

Among the plurality of word lines WL0 to WLm, the word line controller 200 may alternately enable one or more word lines related to the auto-refresh operation, and one or more word lines related to the smart refresh operation. For example, the word line controller 200 may enable 8 word lines at the same time during the auto-refresh operation, and enable a single word line during the smart refresh operation.

Figure 4:
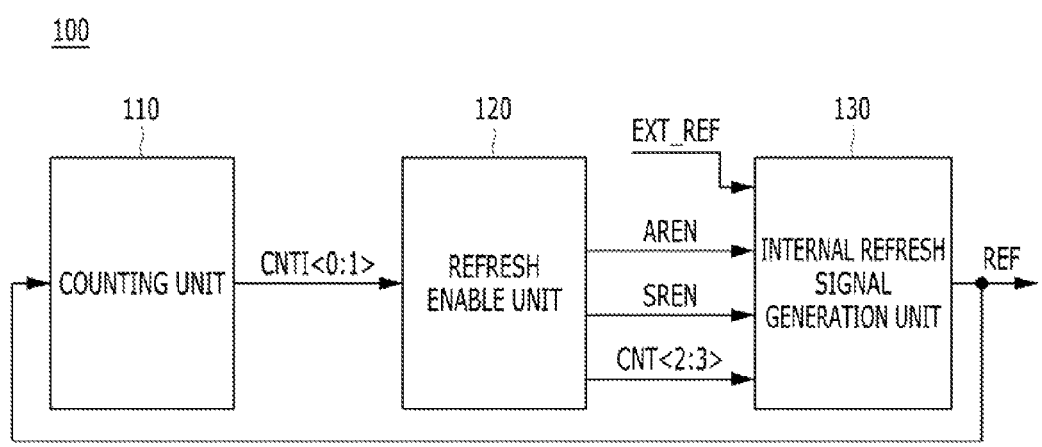
FIG. 4 is a block diagram illustrating a refresh controller shown in FIG. 3.

FIG. 4 is a block diagram illustrating the refresh controller 100 shown in FIG. 3.

Referring to FIG. 4, the refresh controller 100 may include a counting unit 110, a refresh enable unit 120, and an internal refresh signal generation unit 130.

The counting unit 110 may count the internal refresh signal REF and generate 1st and 2nd count signals CNTI<0:1> corresponding to the counting result.

The refresh enable unit 120 may generate the auto-refresh enable signal AREN, the smart refresh enable signal SREN, and 1st and 2nd select control signals CNT<2:3> according to the 1st and 2nd count signals CNTI<0:1>.

The internal refresh signal generation unit 130 may generate the internal refresh signal REF according to the external refresh signal EXT_REF, the auto-refresh enable signal AREN, the smart refresh enable signal SREN, and the 1st and 2nd select control signals CNT<2:3>.

Figure 5:
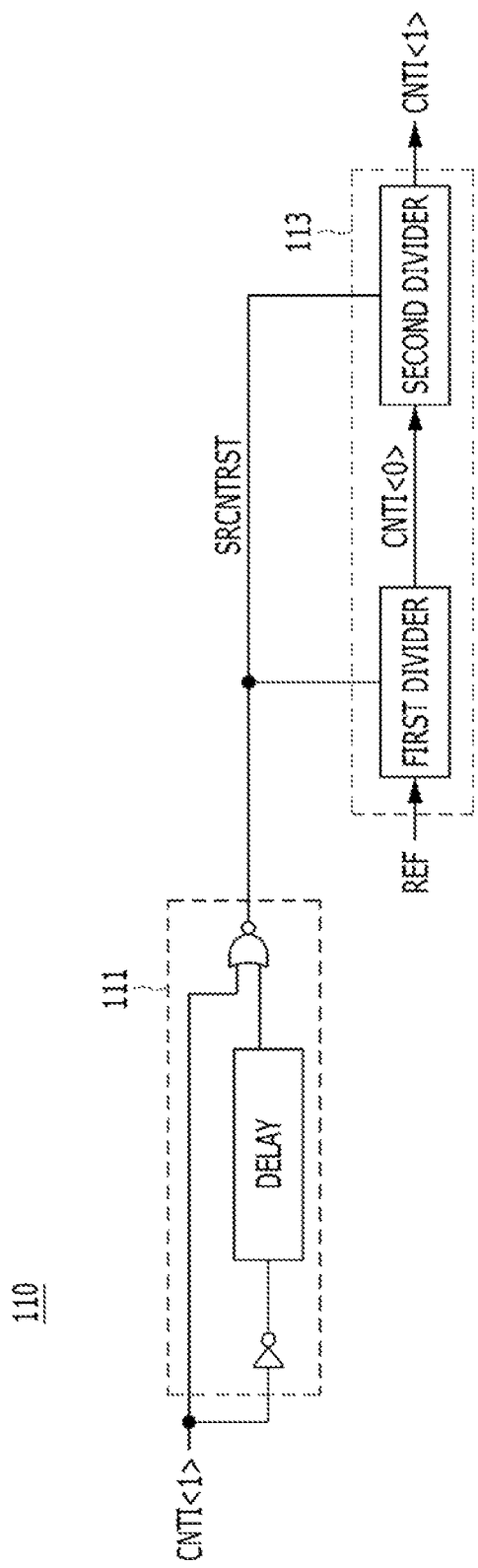
FIG. 5 is a block diagram illustrating a counting unit shown in FIG. 4.

FIG. 5 is a block diagram illustrating the counting unit 110 shown in FIG. 4.

Referring to FIG. 5, the counting unit 110 may include a count reset section 111 and a dividing circuit section 113.

The count reset section 111 may generate a count reset signal SRCNTRST according to the 2nd count signal CNTI<1>.

The dividing circuit section 113 may be reset according to the count reset signal SRCNTRST and generate the 1st and 2nd count signals CNTI<0:1> by dividing the internal refresh signal REF.

The count reset section 111 may include an inverter, a delay, and a NOR gate. The inverter may invert the 2nd count signal CNTI<1>. The delay may delay an output signal of the inverter. The NOR gate may perform a NOR operation on an output signal of the delay and the 2nd count signal CNTI<1>, and may output the count reset signal SRCNTRST. The count reset signal SRCNTRST may be activated after the 2nd count signal CNTI<1> is deactivated.

The dividing circuit section 113 may include a 1st divider and a 2nd divider. The 1st divider may be reset according to the count reset signal SRCNTRST and generate the 1st count signal CNTI<0> by dividing the internal refresh signal REF by two. The 2nd divider may be reset according to the count reset signal SRCNTRST and generate the 2nd count signal CNTI<1> by dividing the 1st count signal CNTI<0> by two.

Figure 6:
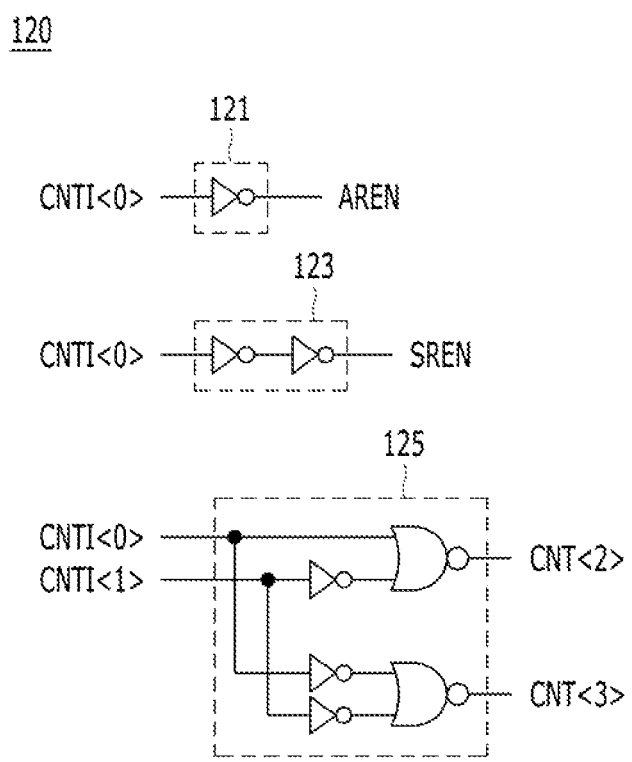
FIG. 6 is a block diagram illustrating a refresh enable unit shown in FIG. 4.

FIG. 6 is a block diagram illustrating the refresh enable unit 120 shown in FIG. 4.

Referring to FIG. 6, the refresh enable unit 120 may include an inverting section 121, a non-inverting section 123, and a combinational logic section 125.

The inverting section 121 may invert the 1st count signal CNTI<0>, and output the auto-refresh enable signal AREN.

The non-inverting section 123 may non-invert the 1st count signal CNTI<0>, and output the smart refresh enable signal SREN.

The combinational logic section 125 may logically combine the 1st and 2nd count signals CNTI<0:1>, and generate the 1st and 2nd select control signals CNT<2:3>.

For example, the inverting section 121 may include an odd number of inverters. The non-inverting section 123 may include an even number of inverters.

The combinational logic section 125 may include a 1st inverter, a 1st NOR gate, a 2nd inverter, a 3rd inverter, and a 2nd NOR gate. The 1st inverter may invert the 2nd count signal CNTI<1>. The 1st NOR gate may perform a NOR operation on an output signal of the 1st inverter and the 1st count signal CNTI<0>, and output the 1st select control signal CNT<2>. The 2nd inverter may invert the 1st count signal CNTI<0>. The 3rd inverter may invert the 2nd count signal CNTI<1>. The 2nd NOR gate may perform a NOR operation on an output signal of the 2nd inverter and an output signal of the 3rd inverter, and output the 2nd select control signal CNT<3>.

Figure 7:
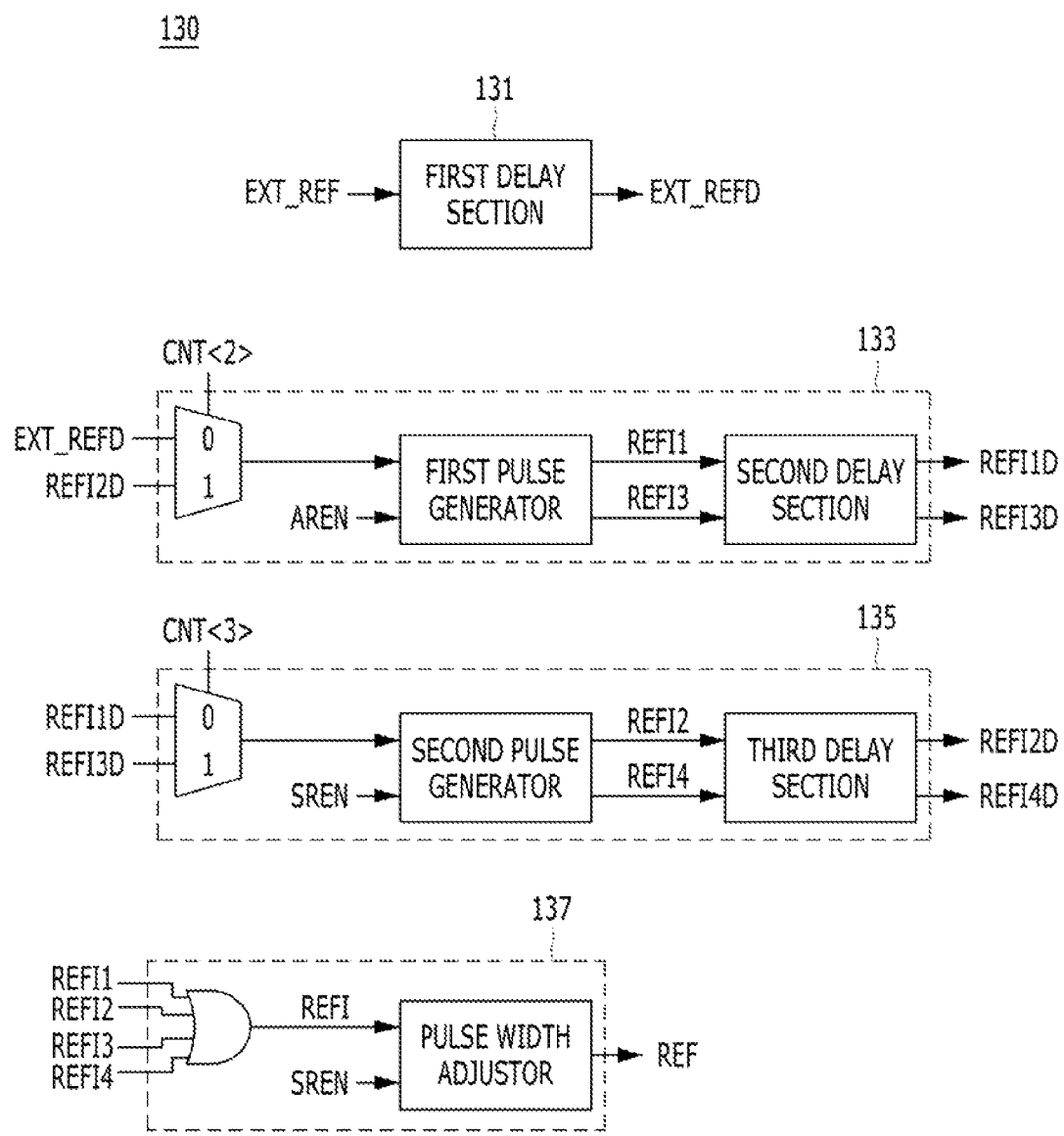
FIG. 7 is a block diagram illustrating an internal refresh signal generation unit shown in FIG. 4.

FIG. 7 is a block diagram illustrating the Internal refresh signal generation unit 130 shown in FIG. 4.

Referring to FIG. 7, the Internal refresh signal generation unit 130 may include a 1st delay section 131, a 1st refresh pulsing section 133, a 2nd refresh pulsing section 135, and an internal refresh signal output section 137.

The 1st delay section 131 may delay the external refresh signal EXT_REF by a predetermined delay time and generate a delayed refresh signal EXT_REFD.

The 1st refresh pulsing section 133 may generate 1st and 3rd refresh pulse signals REFI1 and REFI3, which sequentially pulse in response to an active period of the auto-refresh enable signal AREN during the unit refresh period according to the 1st select control signal CNT<2>, the delayed refresh signal EXT_REFD, a 2nd delayed refresh pulse signal REFI2D, and the auto-refresh enable signal AREN. The 1st refresh pulsing section 133 may generate 1st and 3rd delayed refresh pulse signals REFI1D and REFI3D by delaying the 1st and 3rd refresh pulse signals REFI1 and REFI3.

For example, the 1st refresh pulsing section 133 may include a 1st selector, a 1st pulse generator, and a 2nd delay section.

The 1st selector may select any one of the delayed refresh signal EXT_REFD and the 2nd delayed refresh pulse signal REFI2D according to the 1st select control signal CNT<2>. The 1st pulse generator may generate the 1st and 3rd refresh pulse signals REFI1 and REFI3 according to an output signal of the 1st selector and the auto-refresh enable signal AREN. The 2nd delay section may generate the 1st and 3rd delayed refresh pulse signals REFI1D and REFI3D according to the 1st and 3rd refresh pulse signals REFI1 and REFI3.

The 2nd refresh pulsing section 135 may generate 2nd and 4th refresh pulse signals REFI2 and REFI4, which sequentially pulse in response to an active period of the smart refresh enable signal SREN during the unit refresh period according to the 2nd select control signal CNT<3>, the 1st and 3rd delayed refresh pulse signals REFI1D and REFI3D, and the smart refresh enable signal SREN. The 2nd refresh pulsing section 135 may delay the 2nd and 4th refresh pulse signals REFI2 and REFI4 and generate 2nd and 4th refresh pulse signals REFI2D and REFI4D.

For example, the 2nd refresh pulsing section 135 may include a 2nd selector, a 2nd pulse generator, and a 3rd delay section. The 2nd selector may select any one of the 1st and 3rd delayed refresh pulse signals REFI1D and REFI3D according to the 2nd select control signal CNT<3>. The 2nd pulse generator may generate the 2nd and 4th refresh pulse signals REFI2 and REFI4 according to an output signal of the 2nd selector and the smart refresh enable signal SREN. The 3rd delay section may generate the 2nd and 4th delayed refresh pulse signals REFI2D and REFI4D according to the 2nd and 4th refresh pulse signals REFI2 and REFI4.

The internal refresh signal output section 137 may generate the internal refresh signal REF according to the 1st to 4th refresh pulse signals REFI1 to REFI4 and the smart refresh enable signal SREN.

For example, the internal refresh signal output section 137 may include an OR gate and a pulse width adjustor. The OR gate may perform an OR operation on the 1st to 4th refresh pulse signals REFI1 to REFI4, and generate the internal refresh pulse signal REFI. The pulse width adjustor may generate the internal refresh signal REF by adjusting an active width of the internal refresh pulse signal REFI according to whether the smart refresh enable signal SREN is activated.

Figure 8:
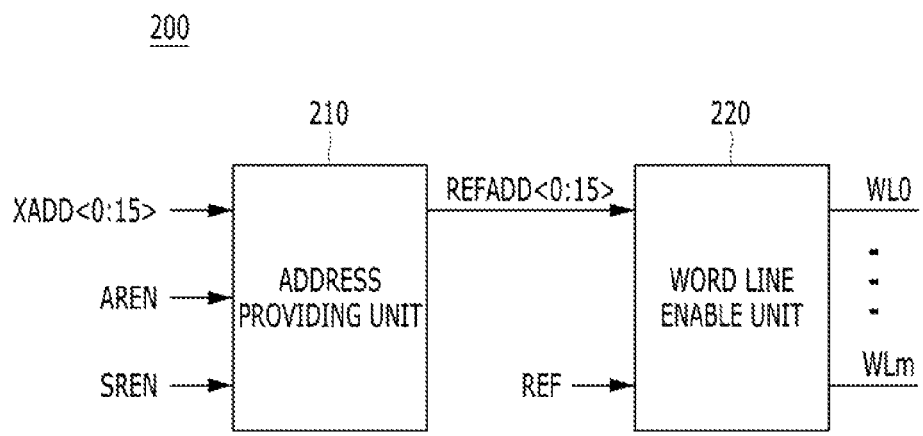
FIG. 8 is a block diagram illustrating a word line controller shown in FIG. 3.

FIG. 8 is a block diagram illustrating the word line controller 200 shown in FIG. 3.

Referring to FIG. 8, the word line controller 200 may include an address providing unit 210 and a word line enable unit 220.

The address providing unit 210 may provide internal refresh addresses REFADD<0:15> according to the auto-refresh enable signal AREN, the smart refresh enable signal SREN, and target addresses XADD<0:15>.

According to internal refresh addresses REFADD<0:15> and the internal refresh signal REF, the word line enable unit 220 may alternately enable one or more word lines related to the normal refresh operation and one or more word lines related to the smart refresh operation among the plurality of word lines WL0 to WLm during the unit refresh period.

Figure 9:
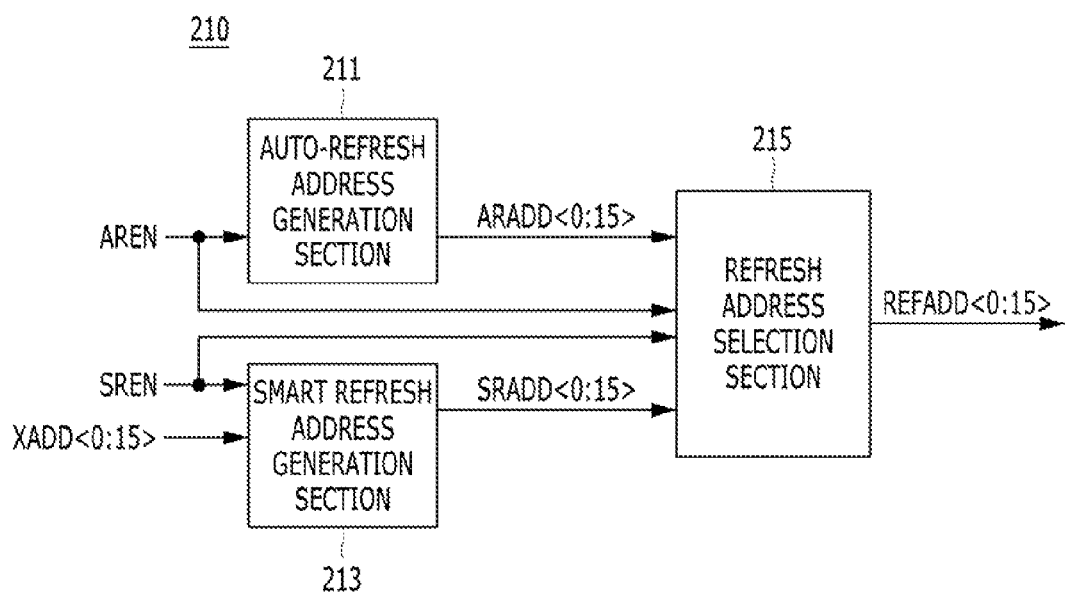
FIG. 9 is a block diagram illustrating an address providing unit shown in FIG. 8.

FIG. 9 is a block diagram illustrating the address providing unit 210 shown in FIG. 8.

Referring to FIG. 9, the address providing unit 210 may include an auto-refresh address generation section 211, a smart refresh address generation section 213, and a refresh address selection section 215.

The auto-refresh address generation section 211 may sequentially generate auto-refresh addresses ARADD<0:15> according to the auto-refresh enable signal AREN.

The smart refresh address generation section 213 may sequentially generate the smart refresh addresses SRADD<0:15> according to the smart refresh enable signal SREN and the target addresses XADD<0:15>.

The refresh address selection section 215 may alternately output the auto-refresh addresses ARADD<0:15> and the smart refresh addresses SRADD<0:15> according to the auto-refresh enable signal AREN and the smart refresh enable signal SREN.

The auto-refresh address generation section 211 may sequentially generate the auto-refresh addresses ARADD<0:

15> which are up-counted or down-counted whenever the auto-refresh enable signal AREN is activated. For example, the auto-refresh address generation section 211 may include an address count circuit.

Figure 10:
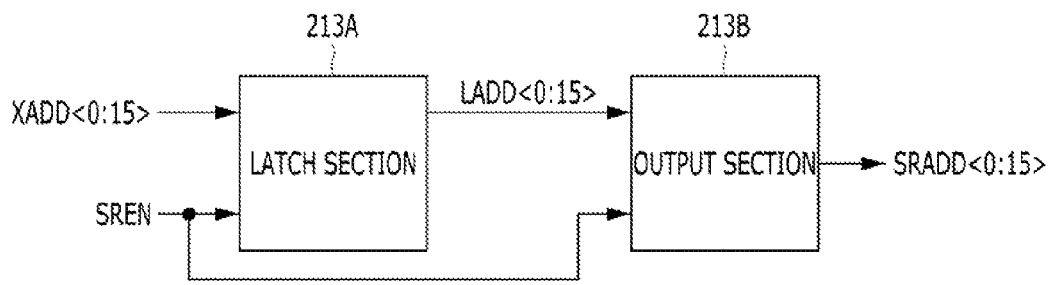
FIG. 10 is a block diagram illustrating a smart refresh address generation section shown in FIG. 9.

FIG. 10 is a block diagram illustrating the smart refresh address generation section 213 shown in FIG. 9.

Referring to FIG. 10, the smart refresh address generation section 213 may include a latch section 213A and an output section 213B.

The latch section 213A may generate latch addresses LADD<0:15> according to the target addresses XADD<0:15> and the smart refresh enable signal SREN.

The output section 213B may sequentially output the smart refresh addresses SRADD<0:15> corresponding to the latch addresses LADD<0:15> whenever the smart refresh enable signal SREN is activated.

The latch section 213A may latch the target addresses XADD<0:15>, and output the latched target addresses as the latch addresses LADD<0:15> according to the smart refresh enable signal SREN.

In response to the latch address LADD<0:15> corresponding to the Nth word line among the plurality of word lines WL0 to WLm, the output section 213B may sequentially output the smart refresh address SRADD<0:15> corresponding to the (N+1)th word line among the plurality of word lines WL0 to WLm and the smart refresh address SRADD<0:15> corresponding to the (N−1)th word line among the plurality of word lines WL0 to WLm during the unit refresh period.

Figure 11:
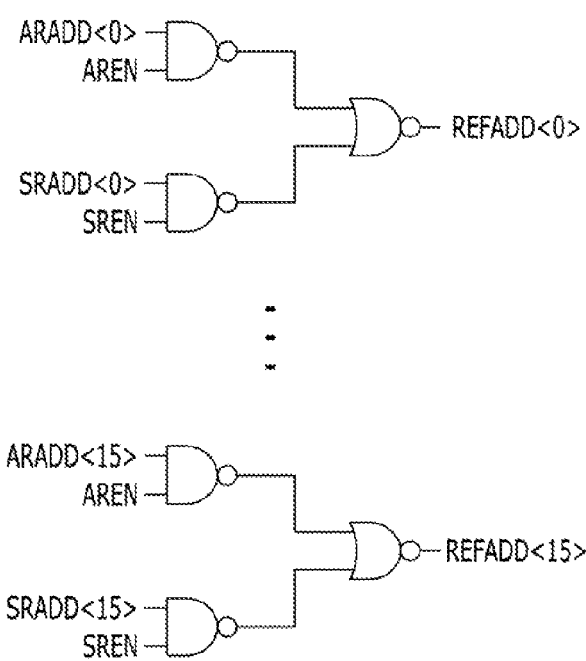
FIG. 11 is a block diagram illustrating a refresh address selection section shown in FIG. 9.

FIG. 11 is a block diagram illustrating the refresh address selection section 215 shown in FIG. 9.

Referring to FIG. 11, the refresh address selection section 215 may output the auto-refresh addresses ARADD<0:15> as the internal refresh addresses REFADD<0:15> when the auto-refresh enable signal AREN is activated, and output the smart refresh addresses SRADD<0:15> as the internal refresh addresses REFADD<0:15> when the smart refresh enable signal SREN is activated.

Hereafter, an operation of the semiconductor device in accordance with the 1st embodiment of the present invention will be described with reference to FIGS. 12 to 14.

Figure 12:
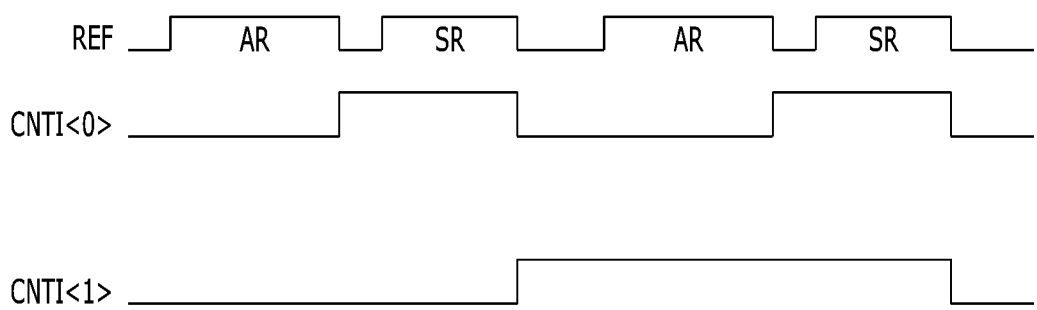
FIG. 12 is a timing diagram illustrating an operation of a counting unit shown in FIG. 5.

FIG. 12 is a timing diagram illustrating the operation of the counting unit 110 shown in FIG. 5.

Referring to FIG. 12, the counting unit 110 may count the internal refresh signal REF, and generate the 1st and 2nd count signals CNTI<0:1> corresponding to the counting result. For example, the dividing circuit section 113 may generate the 1st count signal CNTI<0> by dividing the internal refresh signal REF by two, and generate the 2nd count signal CNTI<1> by dividing the 1st count signal CNTI<0> by two. The dividing circuit section 113 may reset the 1st and 2nd count signals CNTI<0:1> when the 2nd count signal CNT<1> is deactivated. The reset operation may be controlled according to the count reset signal SRNTRST generated from the count reset section 111.

Figure 13:
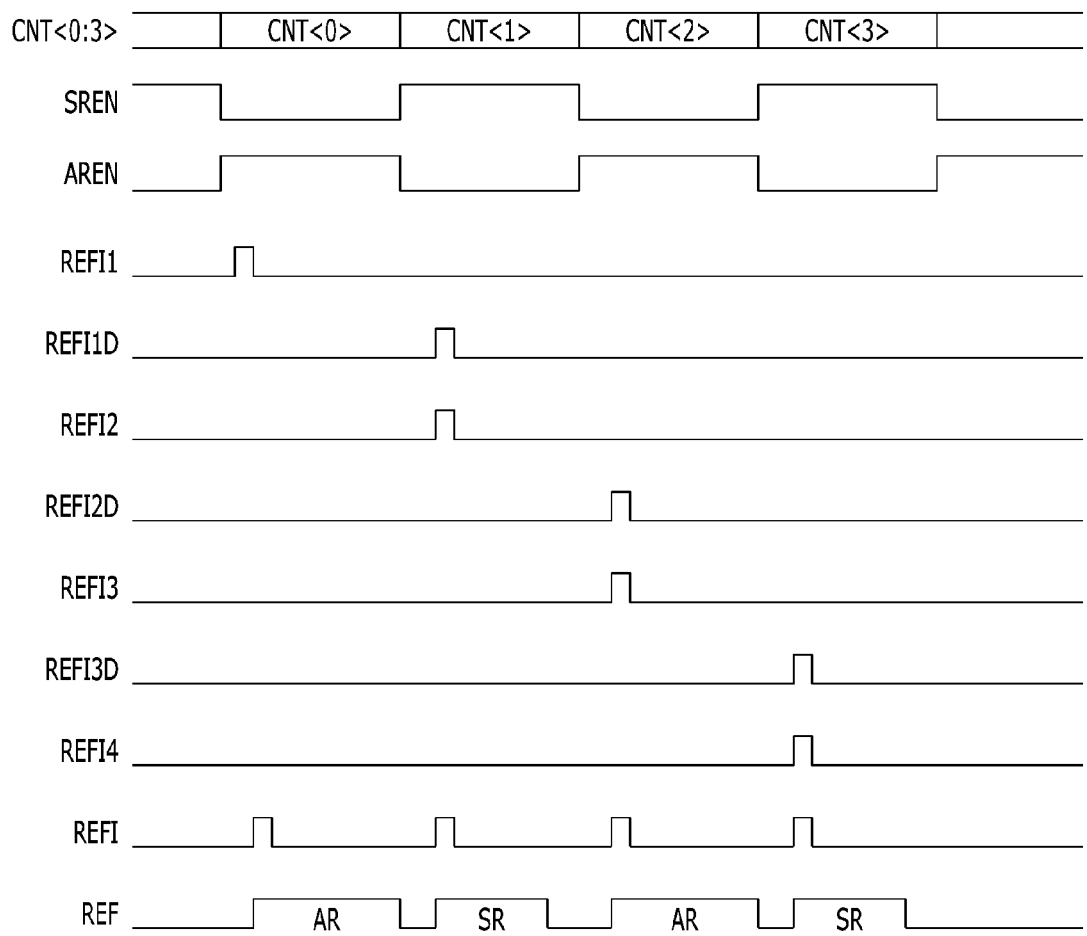
FIG. 13 is a timing diagram illustrating operations of a refresh enable unit shown in FIG. 6 and an internal refresh signal generation unit shown in FIG. 7.

FIG. 13 is a timing diagram Illustrating the operations of the refresh enable unit 120 shown in FIG. 6 and the internal refresh signal generation unit 130 shown in FIG. 7.

Referring to FIG. 13, the refresh enable unit 120 may generate the auto-refresh enable signal AREN, the smart refresh enable signal SREN, and the 1st and 2nd select control signals CNT<2:3> according to the 1st and 2nd count signals CNTI<0:1>.

For example, the inverting section 121 may invert the 1st count signal CNTI<0> and generate the auto-refresh enable signal AREN. The non-inverting section 123 may non-invert the 1st count signal CNTI<0> and generate the smart refresh enable signal SREN. The combinational logic section 125 may logically combine the 1st and 2nd count signals CNTI<0:1> and generate the 1st and 2nd select control signal CNT<2:3>.

The 1st and 2nd select control signals CNT<2:3> may be acquired by counting a number of toggles of the internal refresh signal REF. For example, the 1st select control signal CNT<2> may correspond to a 3rd toggling period of the internal refresh signal REF, and the 2nd select control signal CNT<3> may correspond to a 4th toggling period of the internal refresh signal REF.

The internal refresh signal generation unit 130 may generate the internal refresh signal REF according to the external refresh signal EXT_REF, the auto-refresh enable signal AREN, the smart refresh enable signal SREN, and the 1st and 2nd select control signals CNT<2:3>.

For example, the 1st delay section 131 may delay the external refresh signal EXT_REF by a predetermined delay time, and generate the delayed refresh signal EXT_REFD which is activated at the 1st toggling period of the internal refresh signal REF.

The 1st refresh pulsing section 133 may generate the 1st refresh pulse signal REFI1 corresponding to the delayed refresh signal EXT_REFD according to the auto-refresh enable signal AREN which is activated in response to the 1st toggling period of the internal refresh signal REF. Furthermore, the 1st refresh pulsing section 133 may delay the 1st refresh pulse signal REFI1 and generate the 1st delayed refresh pulse signal REFI1D which pulses at the 2nd toggling period of the internal refresh signal REF.

The 2nd refresh pulsing section 135 may generate the 2nd refresh pulse signal REFI2 corresponding to the 1st delayed refresh pulse signal REFI1 according to the smart-refresh enable signal SREN which is activated in response to the 2nd toggling period of the internal refresh signal REF. Furthermore, the 2nd refresh pulsing section 135 may delay the 2nd refresh pulse signal REFI2 and generate the 2nd delayed refresh pulse signal REFI2D which pulses at the 3rd toggling period of the internal refresh signal REF.

The 1st refresh pulsing section 133 may generate the 3rd refresh pulse signal REFI3 corresponding to the 2nd delayed refresh pulse signal REFI2D according to the auto-refresh enable signal AREN which is activated in response to the 3rd toggling period of the internal refresh signal REF. Furthermore, the 1st refresh pulsing section 133 may delay the 3rd refresh pulse signal REFI3 and generate the 3rd delayed refresh pulse signal REFI3D which pulses at the 4th toggling period of the internal refresh signal REF.

The 2nd refresh pulsing section 135 may generate the 4th refresh pulse signal REFI4 corresponding to the 3rd delayed refresh pulse signal REFI3 according to the smart refresh enable signal SREN which is activated in response to the 4th toggling period of the internal refresh signal REF.

The internal refresh signal output section 137 may perform an OR operation on the 1st to 4th refresh pulse signals REFI1 to REFI4, and generate the internal refresh pulse signal REFI. Furthermore, the internal refresh signal output section 137 may generate the internal refresh signal REF by adjusting the active width of the internal refresh pulse signal REFI according to whether the smart refresh enable signal SREN is activated.

For example, when the smart refresh enable signal SREN is deactivated, the internal refresh signal output section 137 may generate the internal refresh signal REF by adjusting the active width of the Internal refresh pulse signal REFI by a width corresponding to the auto-refresh operation. Furthermore, when the smart refresh enable signal SREN is activated, the internal refresh signal output section 137 may generate the internal refresh signal REF by adjusting the active width of the internal refresh pulse signal REFI by a width corresponding to the smart refresh operation. When the auto-refresh operation is performed, the active width of the internal refresh signal REF may be adjusted more than when the smart refresh operation is performed.

Figure 14:
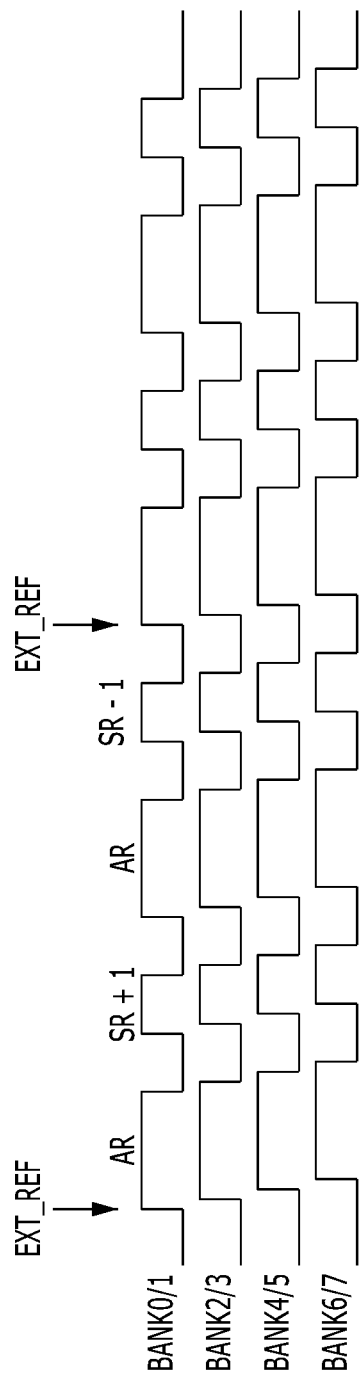
FIG. 14 is a timing diagram illustrating an operation of the word line controller shown in FIG. 3.

FIG. 14 is a timing diagram illustrating the operation of the word line controller 200. FIG. 14 exemplarily illustrates the operation of the word line controller 200 to the plurality of banks BANK0 to BANK7.

Referring to FIG. 14, the word line controller 200 may control the plurality of word lines WL0 to WLm such that the auto-refresh operation and the smart refresh operation are alternately performed according to the auto-refresh enable signal AREN, the smart refresh enable signal SREN, and the internal refresh signal REF during the unit refresh period corresponding to the single external refresh signal EXT_REF. For example, the word line controller 200 may enable 8 word lines at the same time during the normal refresh operation, and enable a single word line during the smart refresh operation.

Figure 15:
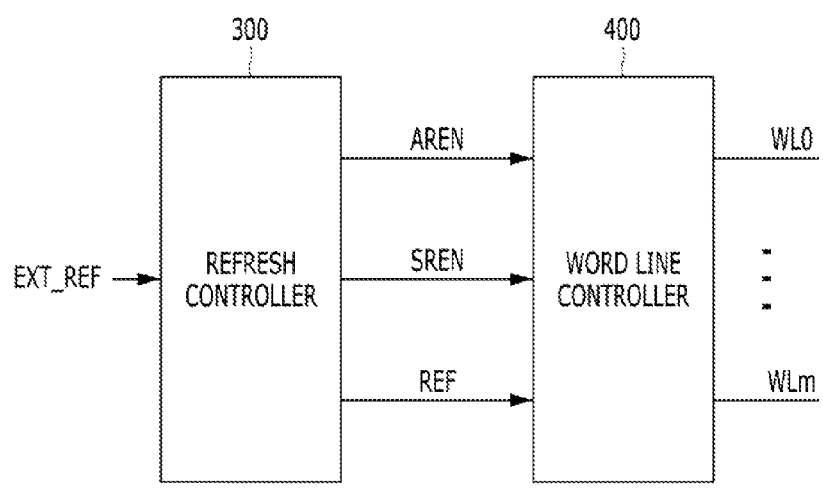
FIG. 15 is a block diagram illustrating a semiconductor device in accordance with a 2nd embodiment of the present invention.

FIG. 15 is a block diagram illustrating a semiconductor device in accordance with a 2nd embodiment of the present invention.

Referring to FIG. 15, the semiconductor device may include a refresh controller 300 and a word line controller 400.

The refresh controller 300 may generate refresh control signals AREN, SREN, and REF for controlling two or more types of refresh operations according to an external refresh signal EXT_REF.

The word line controller 400 may control a plurality of word lines WL0 to WLm such that the two or more types of refresh operations are alternately performed by a predetermined number of times according to the refresh control signals AREN, SREN, and REF during a unit refresh period corresponding to the external refresh signal EXT_REF.

The two or more types of refresh operations may include the auto-refresh operation and the smart refresh operation described above with reference to FIG. 3. Hereafter, two types of refresh operations, that is, the auto-refresh operation and the smart refresh operation will be taken as an example of the two types of refresh operations.

The refresh control signals AREN, SREN, and REF may include the auto-refresh enable signal AREN, the smart refresh enable signal SREN, and the internal refresh signal REF described with reference to FIG. 3. Hereafter, the auto-refresh enable signal AREN, the smart refresh enable signal SREN, and the internal refresh signal REF will be taken as an example illustrating the refresh control signals AREN, SREN, and REF.

Among the plurality of word lines WL0 to WLm, the word line controller 400 may alternately enable one or more word lines related to the auto-refresh operation, and one or more word lines related to the smart refresh operation. For example, the word line controller 400 may enable 8 word lines at the same time during the auto-refresh operation, and enable a single word line during the smart refresh operation.

Figure 16:
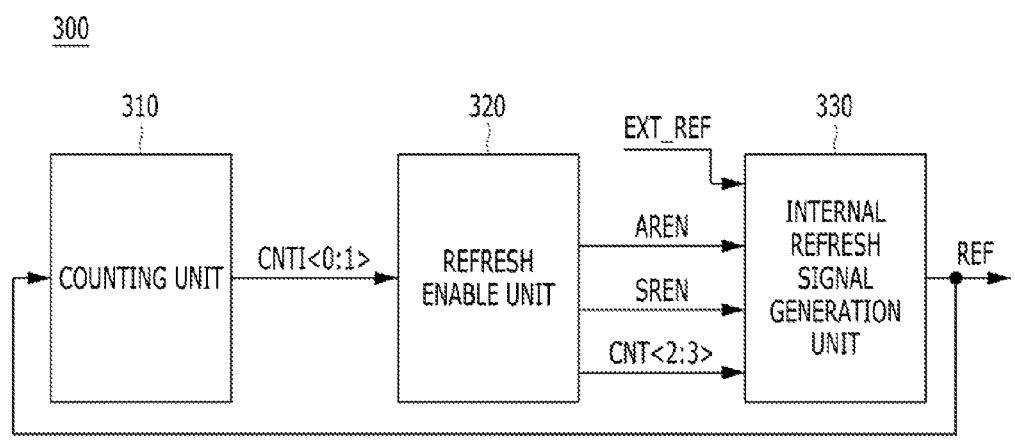
FIG. 16 is a block diagram illustrating a refresh controller shown in FIG. 15.

FIG. 16 is a block diagram illustrating the refresh controller 300 shown in FIG. 15.

Referring to FIG. 16, the refresh controller 300 may include a counting unit 310, a refresh enable unit 320, and an internal refresh signal generation unit 330.

The counting unit 310 may count the internal refresh signal REF and generate 1st and 2nd count signals CNTI<0:1> corresponding to the counting result.

The refresh enable unit 120 may generate the auto-refresh enable signal AREN, the smart refresh enable signal SREN, and 1st and 2nd select control signals CNT<2:3> according to the 1st and 2nd count signals CNTI<0:1>.

The internal refresh signal generation unit 330 may generate the internal refresh signal REF according to an external refresh signal EXT_REF, the auto-refresh enable signal AREN, the smart refresh enable signal SREN, and the 1st and 2nd select control signals CNT<2:3>.

Figure 17:
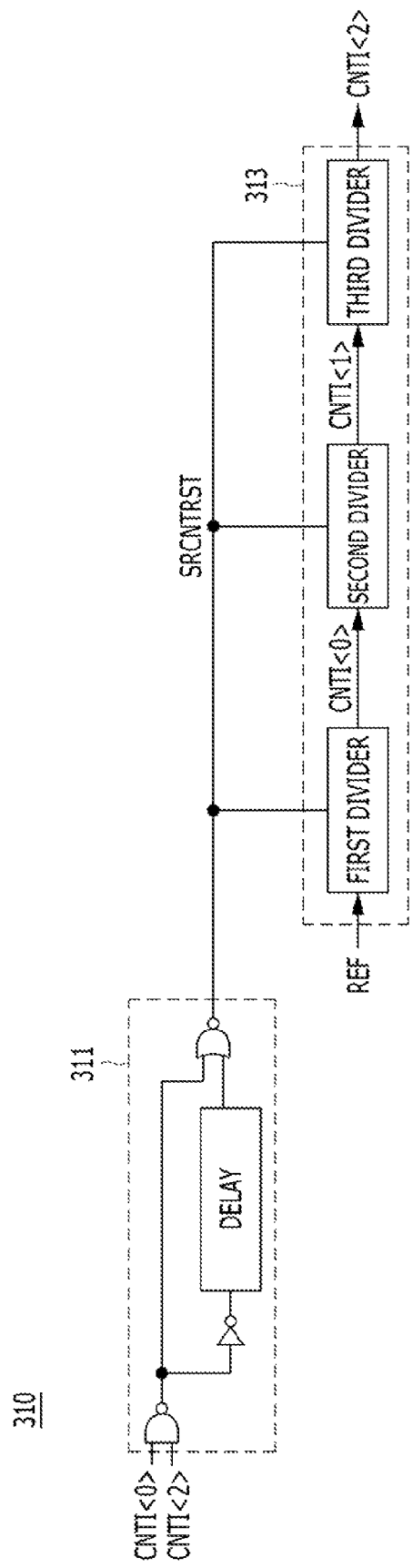
FIG. 17 is a block diagram illustrating a counting unit shown in FIG. 16.

FIG. 17 is a block diagram illustrating the counting unit 310 shown in FIG. 16.

Referring to FIG. 17, the counting unit 310 may include a count reset section 311 and a dividing circuit section 313.

The count reset section 311 may generate a count reset signal SRCNTRST according to the 1st and 3rd count signal CNTI<0> and CNTI<2>.

The dividing circuit section 313 may be reset according to the count reset signal SRCNTRST and generate the 1st to 3rd count signals CNTI<0:2> by dividing the internal refresh signal REF.

The count reset section 311 may include a NAND gate, an inverter, a delay, and a NOR gate. The NAND gate may perform a NAND operation on the 1st and 3rd count signals CNTI<0> and CNTI<2>. The inverter may invert an output signal of the NAND gate. The delay may delay an output signal of the inverter. The NOR gate may perform a NOR operation on an output signal of the delay and the output signal of the NAND gate, and may output the count reset signal SRCNTRST. The count reset signal SRCNTRST may be activated after both of the 1st and 3rd count signals CNTI<0> and CNTI<2> are deactivated.

The dividing circuit section 313 may include a 1st divider, a 2nd divider, and a 3rd divider. The 1st divider may be reset according to the count reset signal SRCNTRST and generate the 1st count signal CNTI<O> by dividing the internal refresh signal REF by two. The 2nd divider may be reset according to the count reset signal SRCNTRST, and generate the 2nd count signal CNTI<1> by dividing the 1st count signal CNTI<O> by two. The 3rd divider may be reset according to the count reset signal SRCNTRST, and generate the 3rd count signal CNTI<2> by dividing the 2nd count signal CNTI<1> by two.

Figure 18:
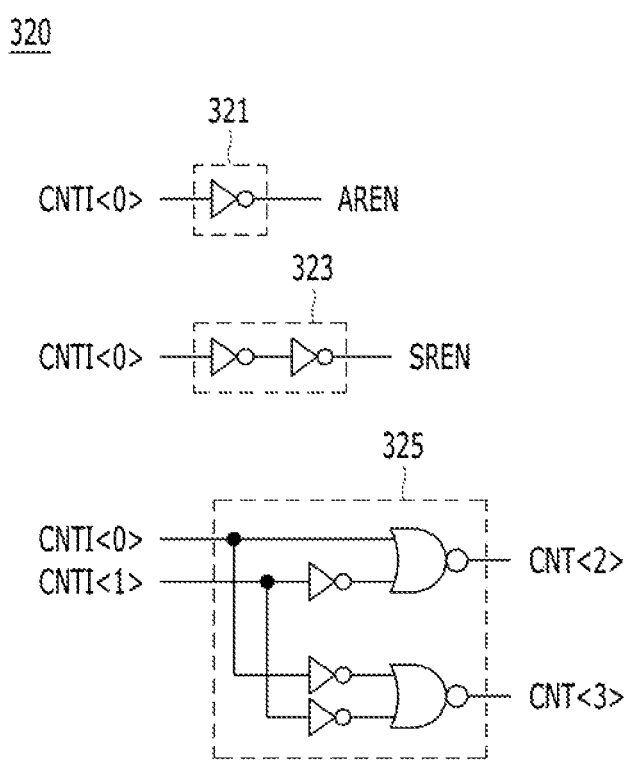
FIG. 18 is a block diagram illustrating a refresh enable unit shown in FIG. 16.

FIG. 18 is a block diagram Illustrating the refresh enable unit 320 shown in FIG. 16.

Referring to FIG. 18, the refresh enable unit 320 may include an inverting section 321, a non-inverting section 323, and a combinational logic section 325.

The inverting section 321 may invert the 1st count signal CNT<0> and output the auto-refresh enable signal AREN.

The non-inverting section 323 may non-invert the 1st count signal CNTI<0> and output the smart refresh enable signal SREN.

The combinational logic section 325 may logically combine the 1st and 2nd count signals CNTI<0:1>, and generate the 1st and 2nd select control signals CNT<2:3>.

For example, the inverting section 321 may include an odd number of inverters. The non-inverting section 323 may include an even number of inverters.

The combinational logic section 325 may include a 1st inverter, a 1st NOR gate, a 2nd inverter, a 3rd inverter, and a 2nd NOR gate. The 1st inverter may invert the 2nd count signal CNTI<1>. The 1st NOR gate may perform a NOR operation on an output signal of the 1st inverter and the 1st count signal CNTI<O>, and output the 1st select control signal CNT<2>. The 2nd inverter may invert the 1st count signal CNTI<0>. The 3rd inverter may invert the 2nd count signal CNTI<1>. The 2nd NOR gate may perform a NOR operation on an output signal of the 2nd inverter and an output signal of the 3rd inverter, and output the 2nd select control signal CNT<3>.

Figure 19:
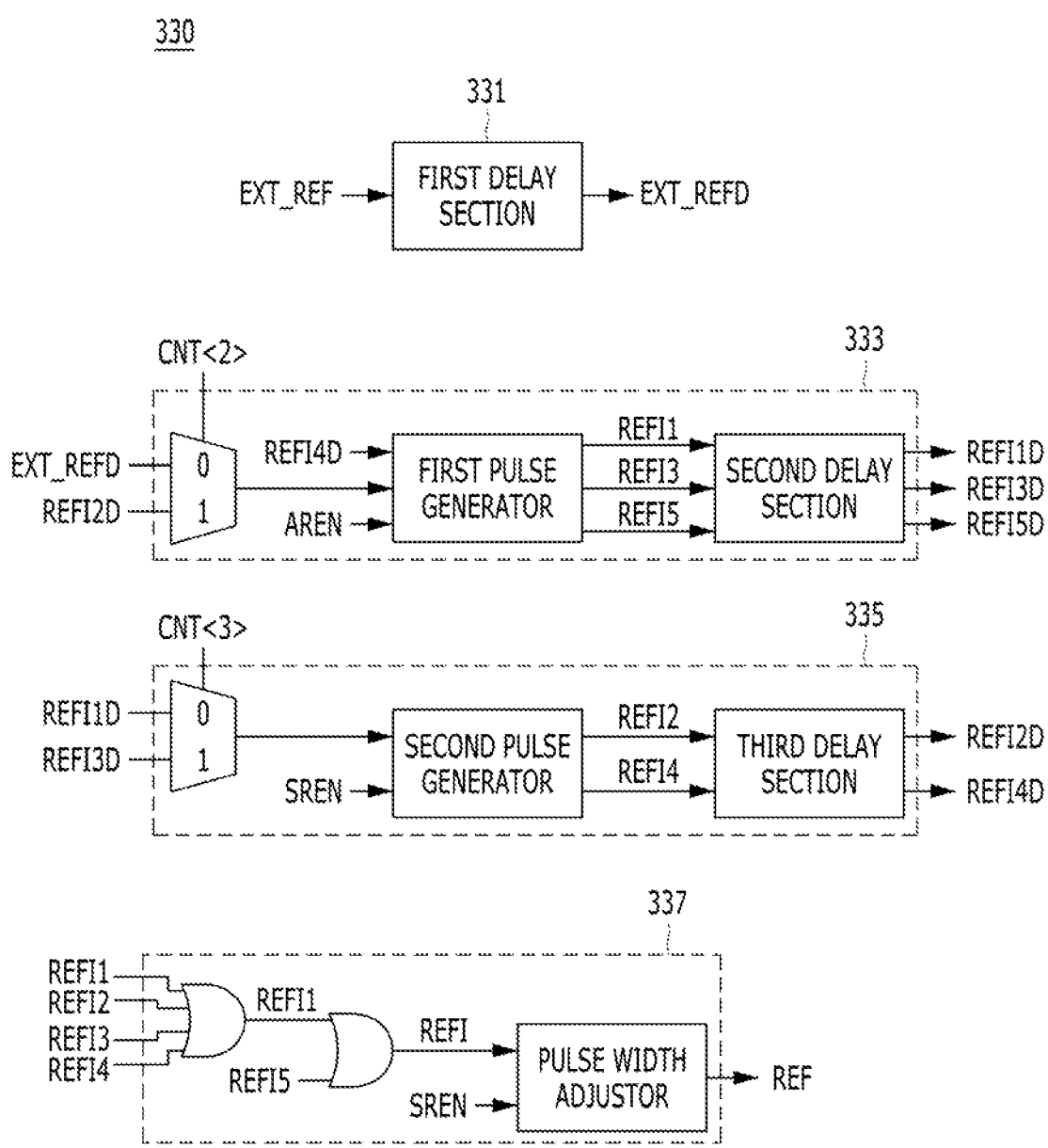
FIG. 19 is a block diagram illustrating an internal refresh signal generation unit shown in FIG. 16.

FIG. 19 is a block diagram illustrating the internal refresh signal generation unit 330 shown in FIG. 16.

Referring to FIG. 19, the internal refresh signal generation unit 330 may include a 1st delay section 331, a 1st refresh pulsing section 333, a 2nd refresh pulsing section 335, and an internal refresh signal output section 337.

The 1st delay section 331 may delay the external refresh signal EXT_REF by a predetermined delay time and generate a delayed refresh signal EXT_REFD. The delayed refresh signal EXT_REFD may be activated at a 1st toggling period of the internal refresh signal REF.

The 1st refresh pulsing section 333 may generate 1st, 3rd, and 5th refresh pulse signals REFI1, REFI3, and REFI5, which sequentially pulse in response to an active period of the auto-refresh enable signal AREN during the unit refresh period according to the 1st select control signal CNT<2>, the delayed refresh signal EXT_REFD, the 2nd and 4th delayed refresh pulse signal REFI2D and REFI4D, and the auto-refresh enable signal AREN. The 1st refresh pulsing section 333 may delay the 1st refresh pulse signal REFI1, the 3rd refresh pulse signal REFI3, and the 5th refresh pulse signal REFI5, and may generate a 1st delayed refresh pulse signal REFI1D, a 3rd delayed refresh pulse signal REFI3D, and a 5th delayed refresh pulse signal REFI5D.

For example, the 1st refresh pulsing section 333 may include a 1st selector, a 1st pulse generator, and a 2nd delay section.

The 1st selector may select any one of the delayed refresh signal EXT_REFD and the 2nd delayed refresh pulse signal REFI2D according to the 1st select control signal CNT<2>. The 1st pulse generator may generate the 1st, 3rd, and 5th refresh pulse signals REFI1, REFI3, and REFI5 according to an output signal of the 1st selector, the auto-refresh enable signal AREN, and the 4th delayed refresh pulse signal REFI4D. The 2nd delay section may generate the 1st, 3rd, and 5th delayed refresh pulse signals REFI1D, REFI3D, and REFI5D according to the 1st, 3rd, and 5th refresh pulse signals REFI1, REFI3, and REFI5.

The 2nd refresh pulsing section 335 may generate 2nd and 4th refresh pulse signals REFI2 and REFI4, which sequentially pulse in response to an active period of the smart refresh enable signal SREN during the unit refresh period according to the 2nd select control signal CNT<3>, the 1st and 3rd delayed refresh pulse signals REFI1D and REFI3D, and the smart refresh enable signal SREN. The 2nd refresh pulsing section 335 may delay the 2nd and 4th refresh pulse signals REFI2 and REFI4 and generate 2nd and 4th refresh pulse signals REFI2D and REFI4D.

For example, the 2nd refresh pulsing section 335 may include a 2nd selector, a 2nd pulse generator, and a 3rd delay section. The 2nd selector may select any one of the 1st and 3rd delayed refresh pulse signals REFI1D and REFI3D according to the 2nd select control signal CNT<3>. The 2nd pulse generator may generate the 2nd and 4th refresh pulse signals REFI2 and REFI4 according to an output signal of the 2nd selector and the smart refresh enable signal SREN. The 3rd delay section may generate the 2nd and 4th delayed refresh pulse signals REFI2D and REFI4D according to the 2nd and 4th refresh pulse signals REFI2 and REFI4.

The internal refresh signal output section 337 may generate the internal refresh signal REF according to the 1st to 5th refresh pulse signals REFI1 to REFI5 and the smart refresh enable signal SREN.

For example, the internal refresh signal output section 337 may include a 1st OR gate, a 2nd OR gate, and a pulse width adjustor. The 1st OR gate may perform an OR operation on the 1st to 4th refresh pulse signals REFI1 to REFI4 and generate a pre-refresh pulse signal REFII. The 2nd OR gate may perform an OR operation on an output signal of the 1st OR gate and the pre-refresh pulse signal REFII, and generate the internal refresh pulse signal REFI. The pulse width adjustor may generate the internal refresh signal REF by adjusting an active width of the internal refresh pulse signal REFI according to whether the smart refresh enable signal SREN is activated.

Figure 20:
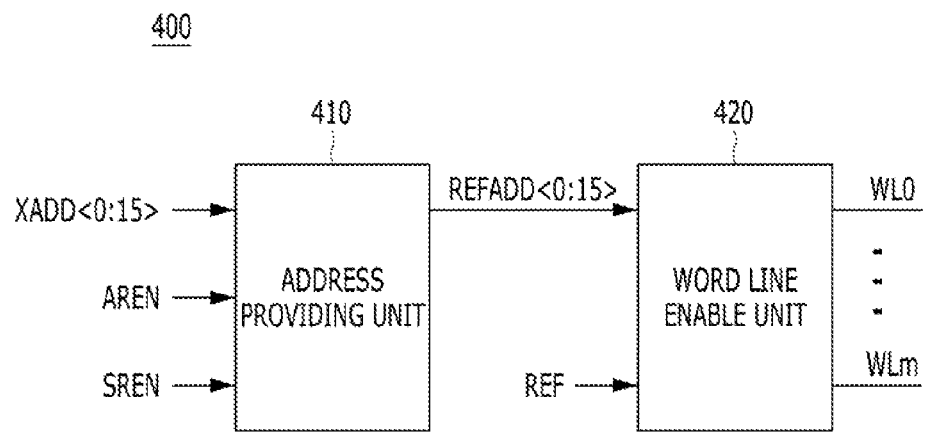
FIG. 20 is a block diagram illustrating a word line controller shown in FIG. 15.

FIG. 20 is a block diagram illustrating the word line controller 400 shown in FIG. 15.

Referring to FIG. 20, the word line controller 400 may include an address providing unit 410 and a word line enable unit 420.

The address providing unit 210 may provide internal refresh addresses REFADD<0:15> according to the auto-refresh enable signal AREN, the smart refresh enable signal SREN, and target addresses XADD<0:15>.

According to internal refresh addresses REFADD<0:15> and the internal refresh signal REF, the word line enable unit 220 may alternately enable one or more word lines related to the normal refresh operation and one or more word lines related to the smart refresh operation among the plurality of word lines WL0 to WLm during the unit refresh period.

Figure 21:
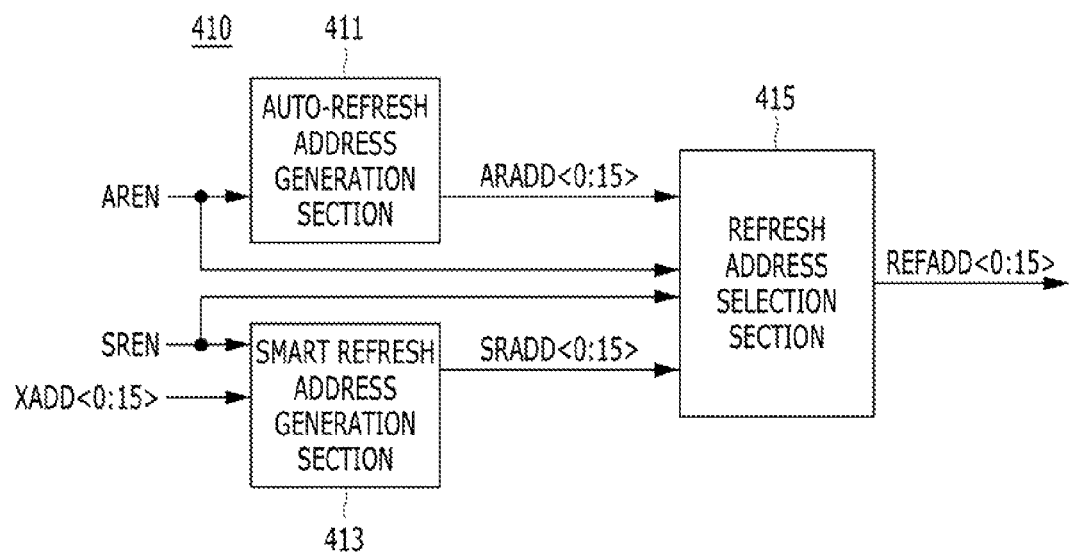
FIG. 21 is a block diagram illustrating an address providing unit shown in FIG. 20.

FIG. 21 is a block diagram illustrating the address providing unit 410 shown in FIG. 20.

Referring to FIG. 21, the address providing unit 410 may include an auto-refresh address generation section 411, a smart refresh address generation section 413, and a refresh address selection section 415.

The auto-refresh address generation section 411 may sequentially generate auto-refresh addresses ARADD<0:15> according to the auto-refresh enable signal AREN.

The smart refresh address generation section 413 may sequentially generate smart refresh addresses SRADD<0:15> according to the smart refresh enable signal SREN and the target addresses XADD<0:15>.

The refresh address selection section 415 may alternately output the auto-refresh addresses ARADD<0:15> and the smart refresh addresses SRADD<0:15> according to the auto-refresh enable signal AREN and the smart refresh enable signal SREN.

The auto-refresh address generation section 411 may sequentially generate the auto-refresh addresses ARADD<0:15> which are up-counted or down-counted whenever the auto-refresh enable signal AREN is activated. For example, the auto-refresh address generation section 411 may include an address count circuit.

Figure 22:
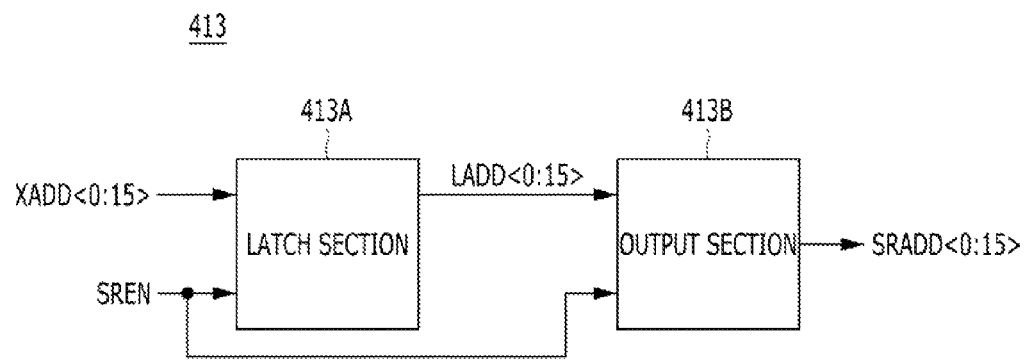
FIG. 22 is a block diagram illustrating a smart refresh address generation section shown in FIG. 21.

FIG. 22 is a block diagram Illustrating the smart refresh address generation section 413 shown in FIG. 21.

Referring to FIG. 22, the smart refresh address generation section 413 may include a latch 413A and an output section 413B.

The latch 413A may generate latch addresses LADD<0:15> according to the target addresses XADD<0:15> and the smart refresh enable signal SREN.

The output section 413B may sequentially output the smart refresh addresses SRADD<0:15> corresponding to the latch addresses LADD<0:15> whenever the smart refresh enable signal SREN is activated.

The latch 413A may latch the target addresses XADD<0:15>, and output the latched target addresses as the latch addresses LADD<0:15> according to the smart refresh enable signal SREN.

In response to the latch address LADD<0:15> corresponding to the Nth word line among the plurality of word lines WL0 to WLm, the output section 413B may sequentially output the smart refresh address SRADD<0:15> corresponding to the (N+1)th word line among the plurality of word lines WL0 to WLm and the smart refresh address SRADD<0:15> corresponding to the (N−1)th word line among the plurality of word lines WL0 to WLm during the unit refresh period.

Figure 23:
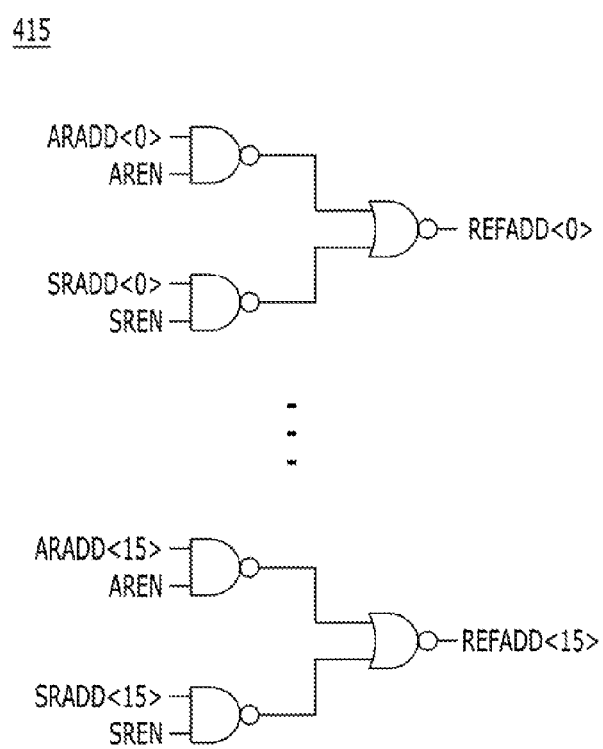
FIG. 23 is a block diagram illustrating a refresh address selection section shown in FIG. 21.

FIG. 23 is a block diagram illustrating the refresh address selection section 415 shown in FIG. 21.

Referring to FIG. 23, the refresh address selection section 415 may output the auto-refresh addresses ARADD<0:15> as the internal refresh addresses REFADD<0:15> when the auto-refresh enable signal AREN is activated, and output the smart refresh addresses SRADD<0:15> as the internal refresh addresses REFADD<0:15> when the smart refresh enable signal SREN is activated.

Hereafter, an operation of the semiconductor device in accordance with the 2nd embodiment of the present invention will be described with reference to FIGS. 24 to 26.

Figure 24:
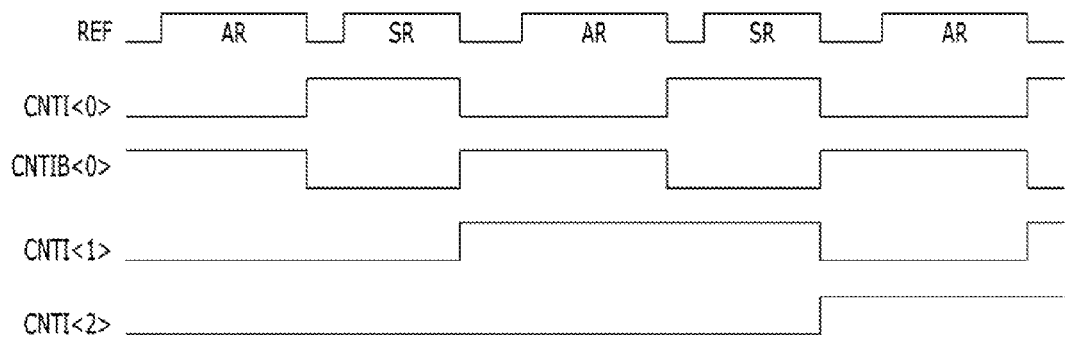
FIG. 24 is a timing diagram illustrating an operation of a counting unit shown in FIG. 17.

FIG. 24 is a timing diagram illustrating the operation of the counting unit 310 shown in 17.

Referring to FIG. 24, the counting unit 310 may count the internal refresh signal REF, and generate the 1st to 3rd count signals CNTI<0:2> corresponding to the counting result. For example, the dividing circuit section 313 may generate the 1st count signal CNTI<0> by dividing the internal refresh signal REF by two, generate the 2nd count signal CNTI<1> by dividing the 1st count signal CNTI<0> by two, and generate the 3rd count signal CNTI<2> by dividing the 2nd count signal CNTI<0> by two. The dividing circuit section 313 may reset the 1st to 3rd count signals CNTI<0:2> when both of the 1st and 3rd count signals CNTI<0> and CNTI<2> are activated. The reset operation may be controlled according to the count reset signal SRNTRST generated from the count reset section 311.

Figure 25:
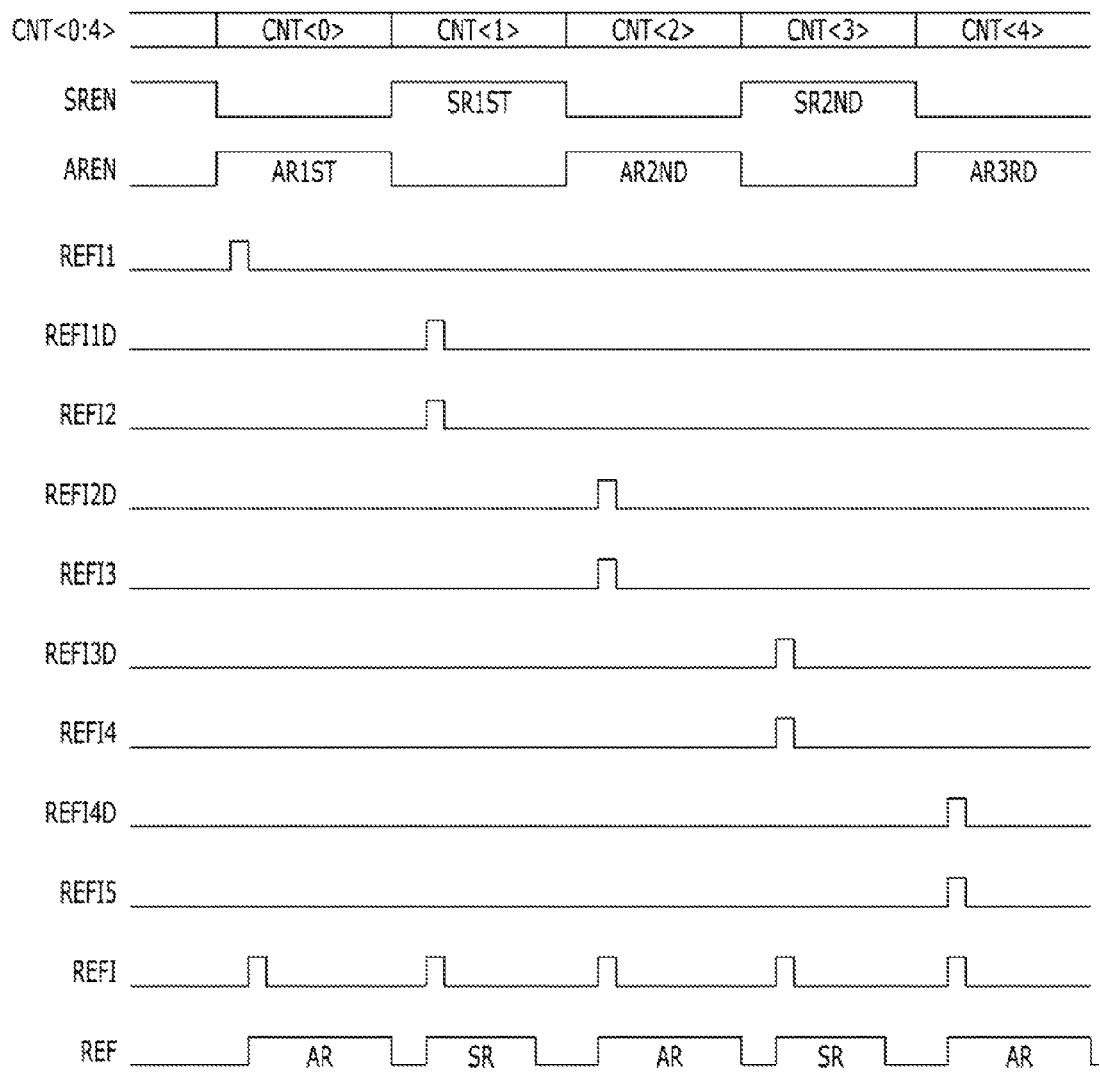
FIG. 25 is a timing diagram illustrating operations of a refresh enable unit shown in FIG. 18 and an internal refresh signal generation unit shown in FIG. 19.

FIG. 25 is a timing diagram illustrating the operations of the refresh enable unit 320 shown in FIG. 18 and the internal refresh signal generation unit 330 shown in FIG. 19.

Referring to FIG. 25, the refresh enable unit 320 may generate the auto-refresh enable signal AREN, the smart refresh enable signal SREN, and the 1st and 2nd select control signals CNT<2:3> according to the 1st and 2nd count signals CNTI<0:1>.

For example, the inverting section 321 may invert the 1st count signal CNTI<O> and generate the auto-refresh enable signal AREN. The non-inverting section 323 may non-invert the 1st count signal CNTI<0> and generate the smart refresh enable signal SREN. The combinational logic section 325 may logically combine the 1st and 2nd count signals CNTI<0:1> and generate the 1st and 2nd select control signal CNT<2:3>.

The 1st and 2nd select control signals CNT<2:3> may be acquired by counting a number of toggles of the internal refresh signal REF. For example, the 1st select control signal CNT<2> may correspond to a 3rd toggling period of the internal refresh signal REF, and the 2nd select control signal CNT<3> may correspond to a 4th toggling period of the internal refresh signal REF.

The internal refresh signal generation unit 330 may generate the internal refresh signal REF according to the external refresh signal EXT_REF, the auto-refresh enable signal AREN, the smart refresh enable signal SREN, and the 1st and 2nd select control signals CNT<2:3>.

For example, the 1st delay section 331 may delay the external refresh signal EXT_REF by a predetermined delay time and generate the delayed refresh signal EXT_REFD. The delayed refresh signal EXT_REFD may be activated at a 1st toggling period of the internal refresh signal REF.

The 1st refresh pulsing section 333 may generate the 1st refresh pulse signal REFI1 corresponding to the delayed refresh signal EXT_REFD according to the auto-refresh enable signal AREN which is activated in response to the 1st toggling period of the Internal refresh signal REF. Furthermore, the 1st refresh pulsing section 133 may delay the 1st refresh pulse signal REF1 and generate the 1st delayed refresh pulse signal REFI1D which pulses at the 2nd toggling period of the internal refresh signal REF.

The 2nd refresh pulsing section 335 may generate the 2nd refresh pulse signal REFI2 corresponding to the 1st delayed refresh pulse signal REFI1 according to the smart-refresh enable signal SREN which is activated in response to the 2nd toggling period of the internal refresh signal REF. Furthermore, the 2nd refresh pulsing section 335 may delay the 2nd refresh pulse signal REFI2 and generate the 2nd delayed refresh pulse signal REFI2D which pulses at the 3rd toggling period of the internal refresh signal REF.

The 1st refresh pulsing section 333 may generate the 3rd refresh pulse signal REFI3 corresponding to the 2nd delayed refresh pulse signal REFI2D according to the auto-refresh enable signal AREN which is activated in response to the 3rd toggling period of the internal refresh signal REF. Furthermore, the 1st refresh pulsing section 333 may delay the 3rd refresh pulse signal REFI3 and generate the 3rd delayed refresh pulse signal REFI3D which pulses at the 4th toggling period of the internal refresh signal REF.

The 2nd refresh pulsing section 335 may generate the 4th refresh pulse signal REFI4 corresponding to the 3rd delayed refresh pulse signal REFI3 according to the smart refresh enable signal SREN which is activated in response to the 4th toggling period of the internal refresh signal REF.

The 1st refresh pulsing section 333 may generate the 5th refresh pulse signal REFI5 corresponding to the 2nd delayed refresh pulse signal REFI4D according to the auto-refresh enable signal AREN which is activated in response to the 5th toggling period of the internal refresh signal REF.

The internal refresh signal output section 337 may perform an OR operation on the 1st to 5th refresh pulse signals REFI1 to REFI5, and generate the internal refresh pulse signal REFI. Furthermore, the internal refresh signal output section 337 may generate the internal refresh signal REF by adjusting the active width of the internal refresh pulse signal REFI according to whether the smart refresh enable signal SREN is activated.

For example, when the smart refresh enable signal SREN is deactivated, the internal refresh signal output section 337 may generate the internal refresh signal REF by adjusting the active width of the Internal refresh pulse signal REFI by a width corresponding to the auto-refresh operation. Furthermore, when the smart refresh enable signal SREN is activated, the internal refresh signal output section 337 may generate the internal refresh signal REF by adjusting the active width of the internal refresh pulse signal REFI by a width corresponding to the smart refresh operation. When the auto-refresh operation is performed, the active width of the internal refresh signal REF may be adjusted more than when the smart refresh operation is performed.

Figure 26:
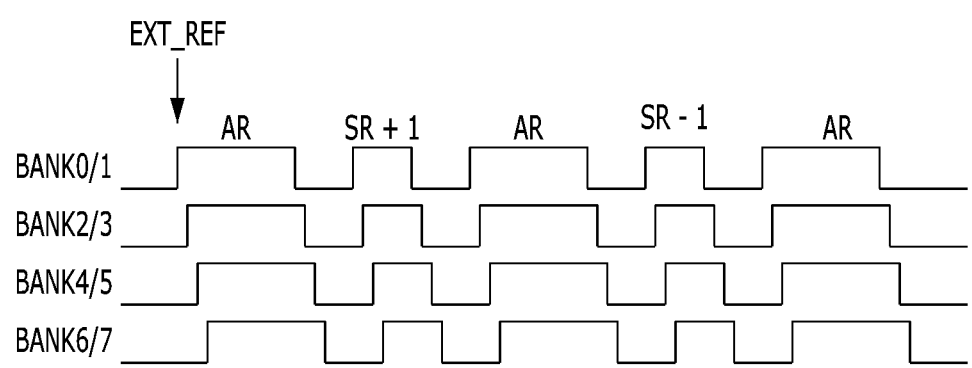
FIG. 26 is a timing diagram illustrating an operation of the word line controller shown in FIG. 15.

FIG. 26 is a timing diagram Illustrating the operation of the word line controller 400. FIG. 26 exemplarily illustrates the operation of the word line controller 400 to the plurality of banks BANK0 to BANK7.

Referring to FIG. 26, the word line controller 400 may control the plurality of word lines WL0 to WLm such that the auto-refresh operation and the smart refresh operation are alternately performed according to the auto-refresh enable signal AREN, the smart refresh enable signal SREN, and the internal refresh signal REF during the unit refresh period corresponding to the single external refresh signal EXT_REF. For example, the word line controller 400 may enable 8 word lines at the same time during the normal refresh operation, and enable a single word line during the smart refresh operation.

In accordance with the embodiments of the present invention, it is possible to minimize the period in which the auto-refresh operations are successively performed, thereby reducing current consumption during the refresh operation.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a refresh controller suitable for generating an auto-refresh enable signal and a smart refresh enable signal which are alternately toggled, and generating an internal refresh signal which pulses whenever the auto-refresh enable signal and the smart refresh enable signal are activated, at each unit refresh period corresponding to an external refresh signal;
   an address providing unit suitable for alternately providing an auto-refresh address and a smart refresh address according to the auto-refresh enable signal, the smart refresh enable signal, and a target address; and
   a word line enable unit suitable for alternately enabling a word line corresponding to the auto-refresh address based on the internal refresh signal corresponding to the auto-refresh enable signal and a word line corresponding to the smart refresh address based on the internal refresh signal corresponding to the smart refresh enable signal a predetermined number of times during the unit refresh period.

2. The semiconductor device of claim 1, wherein the refresh controller comprises:
   a counting unit suitable for generating a plurality of count signals by counting the internal refresh signal;
   a refresh enable unit suitable for generating the auto-refresh enable signal, the smart refresh enable signal, and 1st and 2nd select control signals according to the plurality of count signals; and
   an internal refresh signal generation unit suitable for generating the internal refresh signal according to the external refresh signal, the auto-refresh enable signal, the smart refresh enable signal, and the 1st and 2nd select control signals.

3. The semiconductor device of claim 2, wherein the counting unit comprises:
   a count reset section suitable for generating a count reset signal according to one or more of the plurality of count signals; and
   a dividing circuit section suitable for being reset according to the count reset signal, and generating the plurality of count signals by dividing the internal refresh signal.

4. The semiconductor device of claim 2, wherein the refresh enable unit comprises:
   a combinational logic section suitable for logically combining a 1st count signal obtained by dividing the internal refresh signal by two and a 2nd count signal obtained by dividing the internal refresh signal by four, among the plurality of count signals, and generating the plurality of select control signals;
   an inverting section suitable for generating the auto-refresh enable signal by inverting the 1st count signal; and
   a non-inverting section suitable for generating the smart refresh enable signal by non-inverting the 1st count signal.

5. The semiconductor device of claim 2, wherein the internal refresh signal generation unit comprises:
   a delay section suitable for generating a delayed refresh signal by delaying the external refresh signal by a predetermined delay time;
   a 1st refresh pulsing section suitable for generating a plurality of 1st refresh pulse signals, which sequentially pulse based on an active period of the auto-refresh enable signal during the unit refresh period according to the delayed refresh signal, the auto-refresh enable signal, the 1st select control signal, and a 2nd delayed refresh pulse signal, and suitable for generating a plurality of 1st delayed refresh pulse signals by delaying the plurality of 1st refresh pulse signals;
   a 2nd refresh pulsing section suitable for generating a plurality of 2nd refresh pulse signals, which sequentially pulse based on an active period of the smart refresh enable signal during the unit refresh period according to the plurality of 1st delayed refresh pulse signals obtained by delaying the plurality of 1st refresh pulse signals, the smart refresh enable signal, and the 2nd select control signal, and suitable for generating the 2nd delayed refresh pulse signal by delaying any one of the plurality of 2nd refresh pulse signals; and
   an internal refresh signal output section suitable for generating the internal refresh signal according to the plurality of 1st and 2nd refresh pulse signals and the smart refresh enable signal.

6. The semiconductor device of claim 1, wherein the address providing unit comprises:
   an auto-refresh address generation section suitable for sequentially generating the auto-refresh address according to the auto-refresh enable signal;
   a smart refresh address generation section suitable for sequentially generating the smart refresh address according to the smart refresh enable signal and the target address; and
   a refresh address selection section suitable for alternately outputting the auto-refresh address and the smart refresh address according to the auto-refresh enable signal and the smart refresh enable signal.

7. The semiconductor device of claim 6, wherein the auto-refresh address generation section comprises a count circuit suitable for sequentially generating the auto-refresh address which is up-counted or down-counted whenever the auto-refresh enable signal is activated.

8. The semiconductor device of claim 6, wherein the smart refresh address generation section comprises:
   a latch suitable for latching the target address and outputting the latched target address as a latch address according to the smart refresh enable signal; and
   an output section suitable for sequentially outputting the smart refresh address corresponding to the latch address whenever the smart refresh enable signal is activated.

9. The semiconductor device of claim 8, wherein the output section sequentially outputs the smart refresh address corresponding to an (N+1)th word line and the smart refresh address corresponding to an (N−1)th word line according to the latch address corresponding to an Nth word line among the plurality of word lines.

10. The semiconductor device of claim 1, wherein the word line enable unit enables two or more word lines corresponding to the auto-refresh address at the same time, and enables a single word line corresponding to the smart refresh address.

* * * * *